TERMINAL-EQUIPPED SUBSTRATES
WITH ELECTRICALLY CONDUCTIVE
SURFACES THEREON
Filed Jan. 13, 1964

INVENTOR.
MONROE D. LEVY
BY Roy Eilers
ATTORNEY

Patented Aug. 22, 1967

3,337,830

TERMINAL-EQUIPPED SUBSTRATES WITH ELECTRICALLY CONDUCTIVE SURFACES THEREON

Monroe D. Levy, Frontenac, Mo., assignor to Vactec Incorporated, University City, Mo., a corporation of Missouri
Filed Jan. 13, 1964, Ser. No. 337,488
3 Claims. (Cl. 338—15)

ABSTRACT OF THE DISCLOSURE

A substrate for a light-sensitive element is made of insulating material and has spaced-apart channels therein, a layer of light-sensitive, semi-conductive material overlies and is in intimate engagement with that substrate, a metal layer overlies and is in intimate engagement with part of that layer of light-sensitive, semi-conductive material, a second metal layer overlies and is in intimate engagement with a second part of that layer of light-sensitive, semi-conductive material and is spaced from the first metal layer, terminals have ends thereof lodged within those channels, and electrically-conductive bonding material mechanically holds those ends of those terminals within those channels and electrically connects those ends of those terminals to those metal layers.

Figure 1:
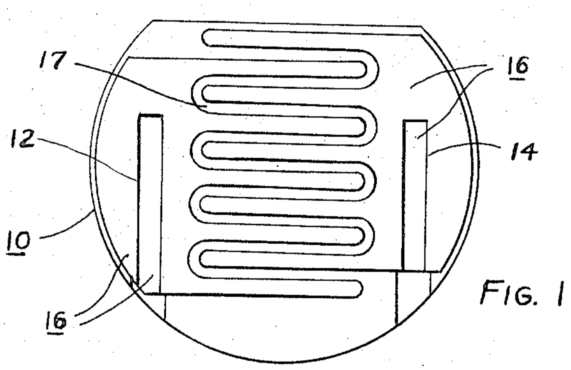

This invention relates to improvements in electrical devices. More particularly, this invention relates to improvements in light-sensitive elements which have substrates with electrically-conductive surfaces thereon.

It is, therefore, an object of the present invention to provide an improved light-sensitive element which has a substrate with an electrically-conductive surface thereon.

A number of light-sensitive elements have substrates with electrically-conductive surfaces thereon; and such elements are desirable because they are small and compact. However, because the electrically-conductive surfaces on those substrates are usually thin, electrically-conductive coatings, it has been difficult to provide strong, low-resistance connections between those electrically-conductive surfaces and the terminals therefor. It would be desirable to provide a substrate, for light-sensitive elements, which had an electrically-conductive surface thereon and which had strong, low-resistance connections between that electrically-conductive surface and the terminals therefor. The present invention provides such a substrate; it is, therefore, an object of the present invention to provide a substrate, for light-sensitive elements, which has an electrically-conductive surface thereon and which has strong, low-resistance connections between that electrically-conductive surface and the terminals therefor.

The substrate provided by the present invention has channels formed in one face thereof, and those channels are dimensioned to accommodate the upper ends of the terminals for the electrically-conductive surface on that substrate. The electrically-conductive surface of the substrate preferably is a thin electrically-conductive coating that is firmly adherent to the said face and to the surfaces of said channels; and that electrically-conductive surface is free of discontinuities in and adjacent to said channels. An electrically-conductive bonding material engages the upper ends of the terminals, engages the electrically-conductive surface, and extends into the channels. The positioning of the upper ends of the terminals within the channels enables the substrate to largely confine and protect those upper ends against blows which could tend to separate those terminals from the electrically-conductive surface. Furthermore, the positioning of the upper ends of the terminals within the channels enables the substrate to hold the terminals substantially fixed. The electrically-conductive bonding material will provide low-resistance connections between the terminals and the electrically-conductive surface for the substrate, and will also positively hold the upper ends of the terminals within the channels. It is, therefore, an object of the present invention to provide channels in one face of a substrate, to provide an electrically-conductive surface on that face and in said channels which is free of discontinuities in and adjacent to said channels, to dispose the upper ends of terminals in said channels, and to cause an electrically-conductive bonding material to engage that electrically-conductive surface and those upper ends of those terminals.

Other and further objects and advantages of the present invention should become apparent from an examination of the drawing and accompanying description.

In the drawing and accompanying description a preferred embodiment of the present invention is shown and described but it is to be understood that the drawing and accompanying description are for the purpose of illustration only and do not limit the invention and that the invention will be defined by the appended claims.

Figure 3:
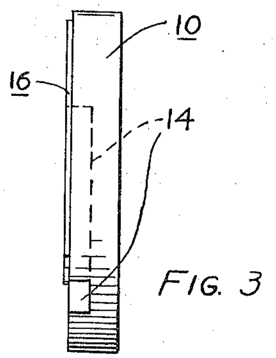
Figure 2:
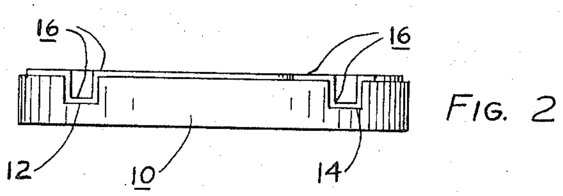
Figure 4:
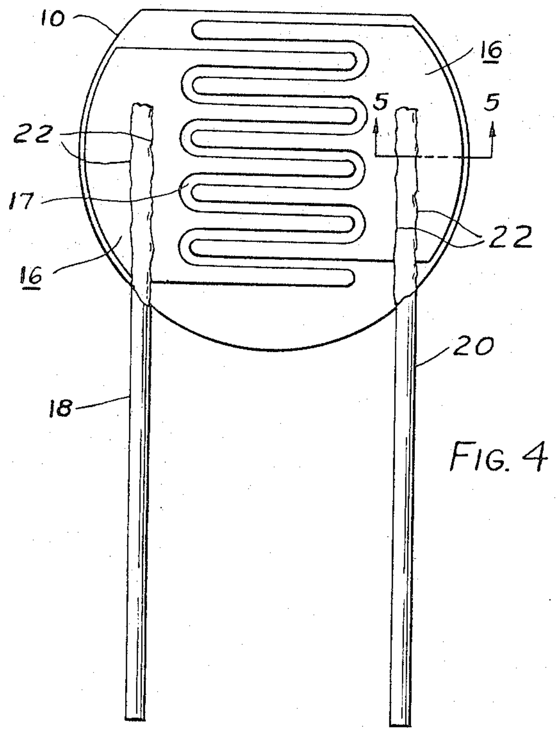
Figure 5:
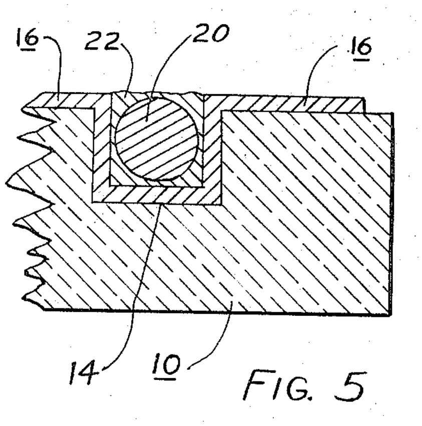

In the drawing:

FIG. 1 is a plan view of a substrate that is made in accordance with the principles and teachings of the present invention and which has an electrically-conductive surface, FIG. 2 is an elevational view of the substrate of FIG. 1, FIG. 3 is a side elevational view of the substrate of FIGS. 1 and 2, FIG. 4 is a plan view of the substrate of FIGS. 1 and 2 after the upper ends of terminals have been set in the channels within that substrate and electrically-conductive bonding material has been applied to those upper ends and to the electrically-conductive surface of that substrate, and FIG. 5 is a sectional view, on an enlarged scale, through the substrate, terminals and electrically-conductive bonding material of FIG. 4, and it is taken along the plane indicated by the line 5—5 in FIG. 4.

Referring to the drawing in detail, the numeral 10 generally denotes a substrate; and that substrate can be made from steatite, porcelain or other material that is strong and that is substantially a non-conductor of electricity. In the preferred embodiment shown, that substrate is D-shaped in plan; and that substrate has two elongated channels 12 and 14 therein. Those channels are disposed at right angles to the flat edge of the substrate 10; and they extend to the opposite edge of that substrate. As indicated particularly by FIG. 2, those channels are generally rectangular in cross section.

The substrate 10 has an electrically-conductive coating 16 thereon; and that coating can be of any desired composition and design. In the said preferred embodiment of substrate provided by the present invention, that electrically-conductive coating is a semiconductive film of cadmium sulphide which is overlain by a grid of indium. The semi-conductive film of cadmium sulphide can be applied to the upper face of the substrate 10 and to the surfaces of the channels 12 and 14 by a vaporizing, spraying, painting, dipping or other operation which will make that film firmly adherent to that substrate and to those channels. The indium grid can be applied to the film of cadmium sulphide by a vaporizing, spraying, painting, dipping or other operation which will make that grid firmly adherent to that film. The particular indium grid shown in FIGS. 1 and 4 has two sections which are spaced apart by a discontinuity 17 of tortuous configuration; and that discontinuity exposes part of the cadmium sulphide film. The coating 16 overlies the greatest part of the area of the upper face of the substrate 10, and it overlies all portions of the surfaces of the channels 12 and 14. Further, that coating is free of discontinuities in and adjacent to the channels 12 and 14.

Terminals 18 and 20 are provided for the coating 16; and those terminals can be short lengths of wire. The thicknesses of the upper ends of the terminals 18 and 20 are slightly smaller than the thicknesses of the channels 12 and 14; and hence those upper ends can fit snugly within the coated channels 12 and 14 without marring or breaking through the coating 16. The channels 12 and 14 have depths which are slightly greater than the thicknesses of the upper ends of the terminals 18 and 20; and hence the outer faces of those upper ends need not project beyond the coated face of the substrate 10. The overall result is that the channels 12 and 14 will protect the upper ends of the terminals 18 and 20 from blows which would tend to dislodge those terminals from the substrate 10. Further, those channels will confine those upper ends and thereby enable the substrate 10 to hold those terminals substantially fixed.

An electrically-conductive bonding material 22 overlies the outer faces of the upper ends of the terminals 12 and 14, and also overlies adjacent portions of the coating 16. In addition, that electrically-conductive bonding material fills those portions of the channels 12 and 14 which are not occupied by the upper ends of the terminals 18 and 20. That electrically-conductive bonding material could be applied in different ways; but it is easily applied by dipping the upper ends of the terminals 18 and 20 into a container of that electrically-conductive bonding material and then urging those upper ends into the channels 18 and 20. That electrically-conductive bonding material will establish and maintain strong, low-resistance connections between the terminals 18 and 20 and the coating 16. Also, that electrically-conductive bonding material will positively hold the upper ends of the terminals 18 and 20 within the channels 12 and 14. Different electrically-conductive bonding materials could be used; but epoxy silver has been found to be very useful.

If desired, the substrate 10 could be made of semiconductive material rather than of insulating material. Where that was done the electrically-conductive coating 16 could be eliminated; and the electrically-conductive bonding material 22 could directly engage the substrate 10 and the upper ends of the terminals 18 and 20 disposed within the channels 12 and 14 in that substrate. For example, if the substrate 10 of a light-sensitive element were made of a semi-conductor, the upper ends of the terminals 18 and 20 could be disposed directly within the channels 12 and 14 in that substrate; and the electrically-conductive bonding material 22 would be applied directly to that substrate and to the upper ends of those terminals to provide low-resistance connections between those terminals and that substrate.

While a coating 16 which consists of a layer of cadmium sulphide with an overlying indium grid is very useful, other coatings could be used. For example, the coating 16 could consist of one or more layers of any material or materials, metallic or non-metallic, that had the desired electrical characteristics. Further, the coating 16—or the bare surface of the substrate 10—can have differing degrees of resistance; and that coating or that bare surface will be considered, for the purposes of this specification and the appended claims, to be electrically-conductive as long as a detectable and useful current can be made to flow through it.

The forming of the channels 12 and 14 so they lie within the face of the substrate 10 makes it possible to use terminals that are straight rather than bent. As a result, those terminals can be formed by merely cutting off lengths of wire, and do not require bending or forming operations. Further, those portions of the terminals 18 and 20 which project beyond the edge of the substrate 10 are able to lie in the plane of that substrate. The overall result is that the space required for the light-sensitive element, of which the substrate 10 is a part, is quite small. This means that the said element can easily and efficiently be stored, shipped, and used.

In one preferred embodiment of the present invention, the substrate 10 was as thin as forty thousandths of an inch; and the channels 12 and 14 were twenty thousandths of an inch thick and were twenty thousandths of an inch deep. The terminals 18 and 20 were seventeen thousandths of an inch thick; and the coating 16 was less than one and one-half thousandths of an inch thick. With such dimensions, the upper ends of the terminals 18 and 20 readily fitted into the channels 18 and 20 without marring or breaking that coating, and yet those channels provided full support for those terminals.

Whereas the drawing and accompanying description have shown and described a preferred embodiment of the present invention, it should be apparent to those skilled in the art that various changes may be made in the form of the invention without affecting the scope thereof.

What I claim is:

1. A light-sensitive element which comprises:
a substrate of material that is substantially a non-conductor of electricity,
a channel in said substrate,
said channel extending to and communicating with the periphery of said substrate,
a second channel in said substrate,
said second channel extending to and communicating with the periphery of said substrate,
said channels being spaced apart,
a layer of light-sensitive, semi-conductive material overlying and firmly adherent to said substrate,
said layer of light-sensitive, semiconductive material extending into and firmly adherent to the surfaces of both of said channels,
a layer of metal overlying and firmly adherent to part of the outer surface of said light-sensitive, semi-conductive layer,
said layer of metal extending into the first said channel and overlying and firmly adherent to said portion of said light-sensitive, semi-conductive material which extends into the first said channel,
a second layer of metal overlying and firmly adherent to a further part of said outer surface of said light-sensitive, semi-conductive layer,
said second layer of metal extending into said second channel and overlying and firmly adherent to said portion of said light-sensitive, semi-conductive material which extends into said second channel,
said layers of metal being spaced apart and being electrically isolated from each other except through said light-sensitive, semi-conductive layer,
electrically-conductive terminals which have ends thereof disposed within said channels,
said ends of said terminals having thicknesses which are smaller than the thicknesses of said channels so said ends of said terminals can be freely introduced into said channels,
electrically-conductive bonding material disposed within the first said channel that engages said end of said terminal in said channel and also engages the first said metal layer, and
further electrically-conductive bonding material disposed within said second channel that engages said end of said terminal within said second channel and that engages said second metal layer,
the first said and said further electrically-conductive bonding material mechanically securing said ends of said terminals within said channels and also electrically bonding said ends of said terminals to said metal layers,
said channels substantially protecting said ends of said terminals against blows which could tend to separate said terminals from said substrate and from said metal layers.

2. A light-sensitive element as claimed in claim 1 wherein said channels are straight, wherein said ends of said terminals are straight, wherein said channels have depths that are greater than the thicknesses of said ends of said terminals so all portions of said ends of said terminals are enclosed and protected by said channels, and wherein said ends of said terminals have thicknesses close to the thicknesses of said channels so said channels will closely confine and support said ends of said terminals.

3. A light-sensitive element as claimed in claim 1 wherein said layer of light-sensitive, semi-conductive material is free of discontinuities in and adjacent to said channels, wherein the first said metal layer is free of discontinuities in and adjacent to the first said channel, and wherein said second metal layer is free of discontinuities in and adjacent to said second channel.

References Cited

UNITED STATES PATENTS

| | | | |
|---|---|---|---|
| 2,413,539 | 12/1946 | Ballard. | |
| 2,849,583 | 8/1958 | Pritikin. | |
| 2,937,354 | 5/1960 | Mazzarello et al. | 338—22 |
| 3,117,298 | 1/1964 | Grunwald | 338—312 |

FOREIGN PATENTS

| | | |
|---|---|---|
| 966,369 | 3/1950 | France. |

DARRELL L. CLAY, *Primary Examiner.*

LEWIS H. MYERS, *Examiner.*